United States Patent [19]

Lee et al.

[11] Patent Number: 5,227,321
[45] Date of Patent: Jul. 13, 1993

[54] METHOD FOR FORMING MOS TRANSISTORS

[75] Inventors: Ruojia Lee; Ceredig Roberts; Dave Cheffings, all of Boise, Id.

[73] Assignee: Micron Technology, Inc., Boise, Id.

[21] Appl. No.: 899,830

[22] Filed: Jun. 15, 1992

Related U.S. Application Data

[63] Continuation of Ser. No. 548,015, Jul. 5, 1990, abandoned.

[51] Int. Cl.[5] .......................................... H01L 21/265
[52] U.S. Cl. .......................................... 437/44; 437/29; 437/34; 437/36; 437/913; 148/DIG. 82; 148/DIG. 143
[58] Field of Search .................... 437/27, 29, 150, 154, 437/158, 36, 34, 913, 44; 148/DIG. 43, DIG. 82, DIG. 143

[56] References Cited

U.S. PATENT DOCUMENTS

| Re. 32,800 | 12/1988 | Han et al. ................ | 437/44 |
|---|---|---|---|
| 3,940,288 | 2/1976 | Takagi et al. ................ | 437/36 |
| 4,149,904 | 4/1979 | Jones ................ | 437/36 |
| 4,182,023 | 1/1980 | Cohen et al. ................ | 437/36 |
| 4,198,250 | 4/1980 | Jecmen ................ | 437/36 |
| 4,319,395 | 3/1982 | Lund et al. ................ | 437/36 |
| 4,616,399 | 10/1986 | Ooka ................ | 437/41 |
| 4,933,994 | 6/1990 | Orbon ................ | 437/34 |

FOREIGN PATENT DOCUMENTS 0079719 5/1983 Japan ................ 437/27
0201415 11/1984 Japan ................ 437/36

OTHER PUBLICATIONS

Sze, "Semiconductor devices physics and technology", 1985, p. 159.
Howes et al., "Gallium Arsenide Materials, Devices, and Circuits", 1985, p. 282.

*Primary Examiner*—Brian E. Hearn
*Assistant Examiner*—Tuan Nguyen
*Attorney, Agent, or Firm*—Wells, St. John, Roberts, Gregory & Matkin

[57] ABSTRACT

A method for implanting diffusion regions during production of MOS transistors involves first patterning and etching a gate to produce a resist overhang covering at least one edge of the gate. Primary dopant is then implanted in the substrate to produce a first diffusion region having at least one boundary partially defined by the resist overhang covering the gate. By isotropically etching the resist on the gate, the gate itself is used as a mask during subsequent implantation of a halo diffusion region. The size of both the first diffusion region and the halo diffusion region is subsequently adjusted by annealing.

18 Claims, 5 Drawing Sheets

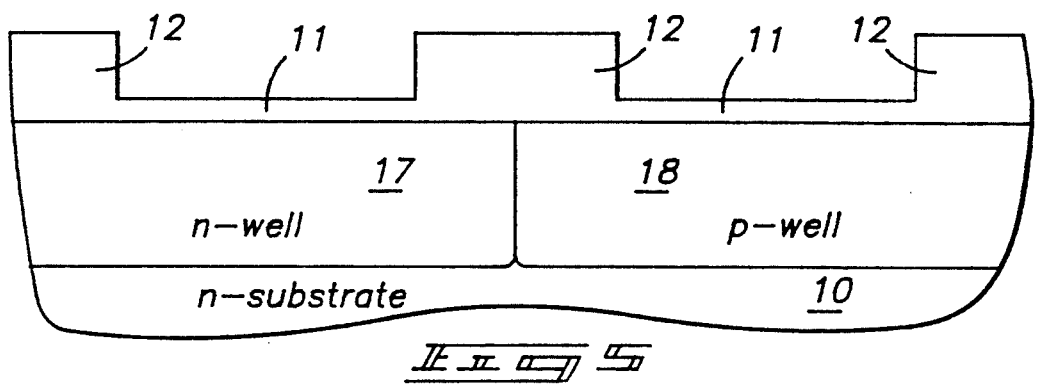
_FIG 5_
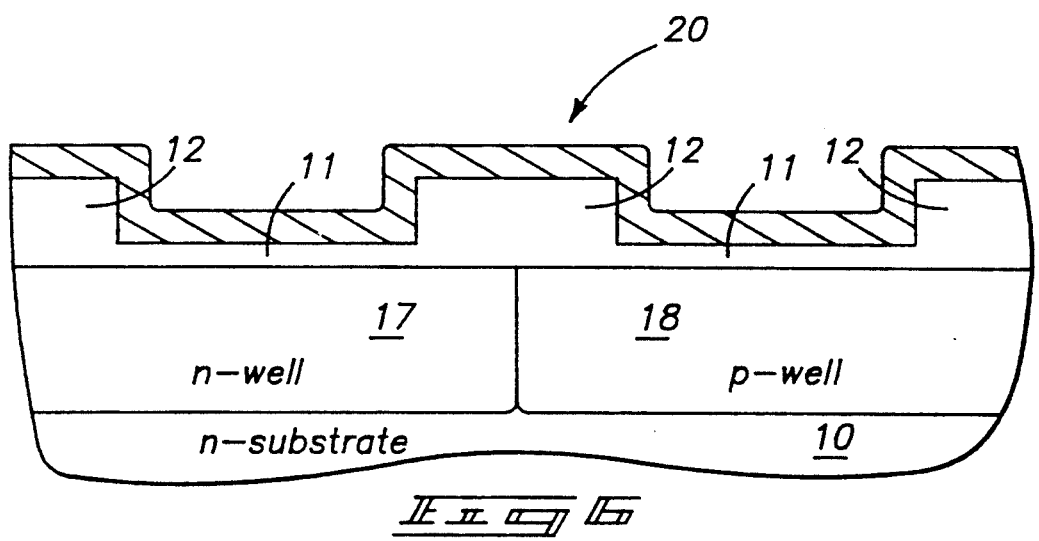
_FIG 6_
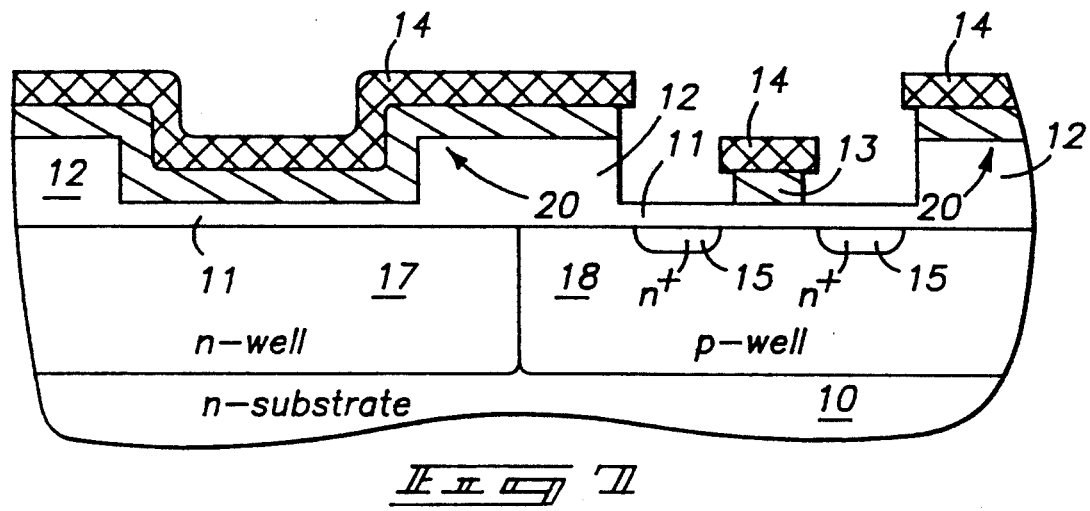
_FIG 7_

METHOD FOR FORMING MOS TRANSISTORS

RELATED APPLICATIONS

This is a continuation of pending U.S. patent application Ser. No. 07/548,015, filed on Jul. 5, 1990 now abandoned.

TECHNICAL FIELD

This disclosure relates to production of MOS transistors in integrated circuits. It is particularly directed to production of high density memory devices using split poly technology.

BACKGROUND OF THE INVENTION

The development of high density memory devices in integrated circuits has lead to increasingly smaller dimensions between devices and between components of devices included within such circuits. Conventional production of short channel MOS transistors is accomplished by numerous photomask steps of increasing complexity. Many of these steps are required to control implantation of the diffusion regions adjacent the controlling gates in such transistors. Implant technology has also led to use of lightly-doped diffusion regions and halo implants designed to reduce transistor short channels effects.

The present method was designed to reduce the number of mask steps required to produce CMOS transistors, while assuring operational integrity in short channel transistors.

In the production of most CMOS devices, the N-channel transistors and P-channel transistors are constructed in an alternating sequence of steps where both gates are first formed and the associated diffusion regions are then implanted to complete the basic complementary devices.

To reduce the number of masking steps involved in such production techniques, split-poly procedures have been developed wherein the differing transistors are processed separately. A first gate is formed from a layer of polysilicon, which temporarily masks the area in which the complementary transistors is to be later formed. The substrate is then implanted adjacent to the first gate. The complementary gate is then formed. The resist used in its formation temporarily covers the area of the completed transistor during implantation of the second transistor area on the supporting substrate.

As implanting dimensions have become smaller, it has become more difficult to control the area of implantation in such transistors, particularly during the implanting of the second set of transistors in the complementary pairs of transistors required in CMOS transistor production. The present invention was designed to assure that implantation of the second set of transistors would not affect the previously-implanted transistors.

BRIEF DESCRIPTION OF THE DRAWINGS

The preferred embodiment of the invention is illustrated in the accompanying drawings, in which:

FIG. 5 is a first diagrammatic view illustrating application of the process to split-poly techniques;

FIG. 6 is a similar view showing application of a poly blanket;

FIG. 7 is a similar view after initial etching of one gate;

DETAILED DESCRIPTION OF THE PREFERRED EMBODIMENTS

The following disclosure of the invention is submitted in furtherance with the constitutional purpose of the Patent Laws "to promote the progress of science and useful arts⇌ (Article 1, Section 8).

The basic method can best be understood by studying FIGS. 1-4, which illustrate the steps as carried out with regard to a single transistor including a polysilicon (poly) gate 13 overlying an area of thinoxide 11 on a supporting substrate 10.

The first step of the present method (FIG. 1) involves patterning and etching gate 13 in the layer of polysilicon by sequentially applying first an anisotropic etch and then an isotropic etch after first applying a blanket layer of resist 14. This produces a resist overhang covering one or more edges of gate 13.

Figure 1:
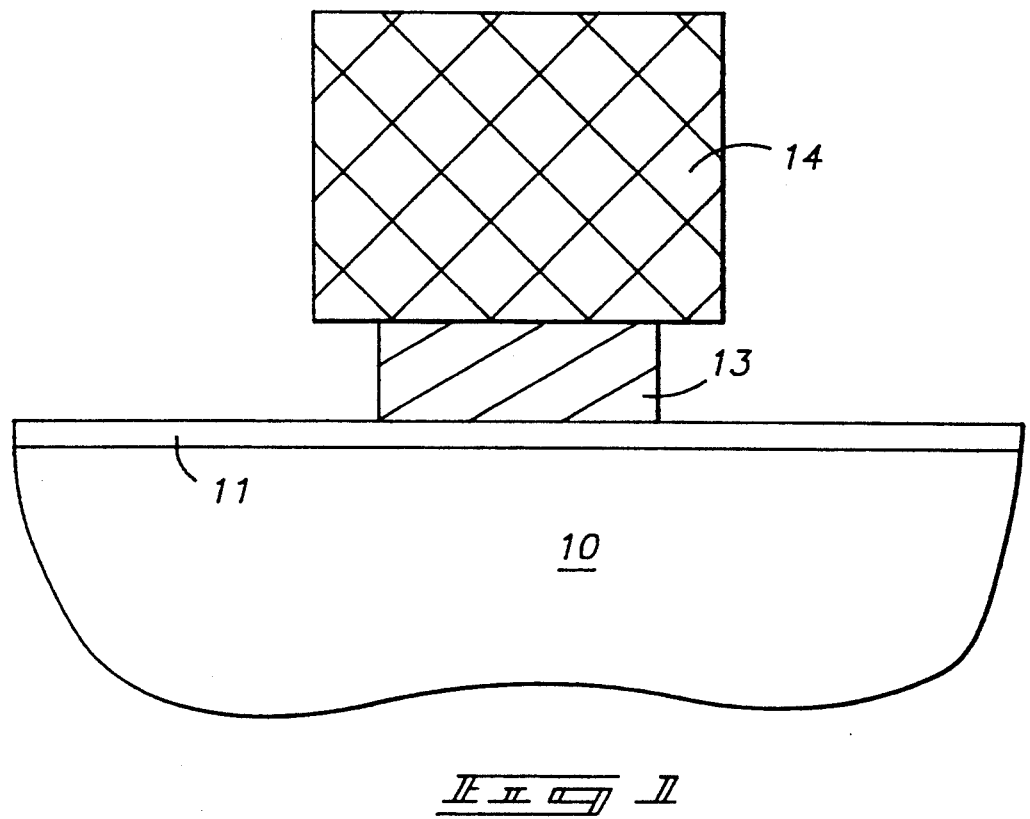
FIG. 1 is a simplified cross-sectional view of a gate prior to implantation.
Figure 2:
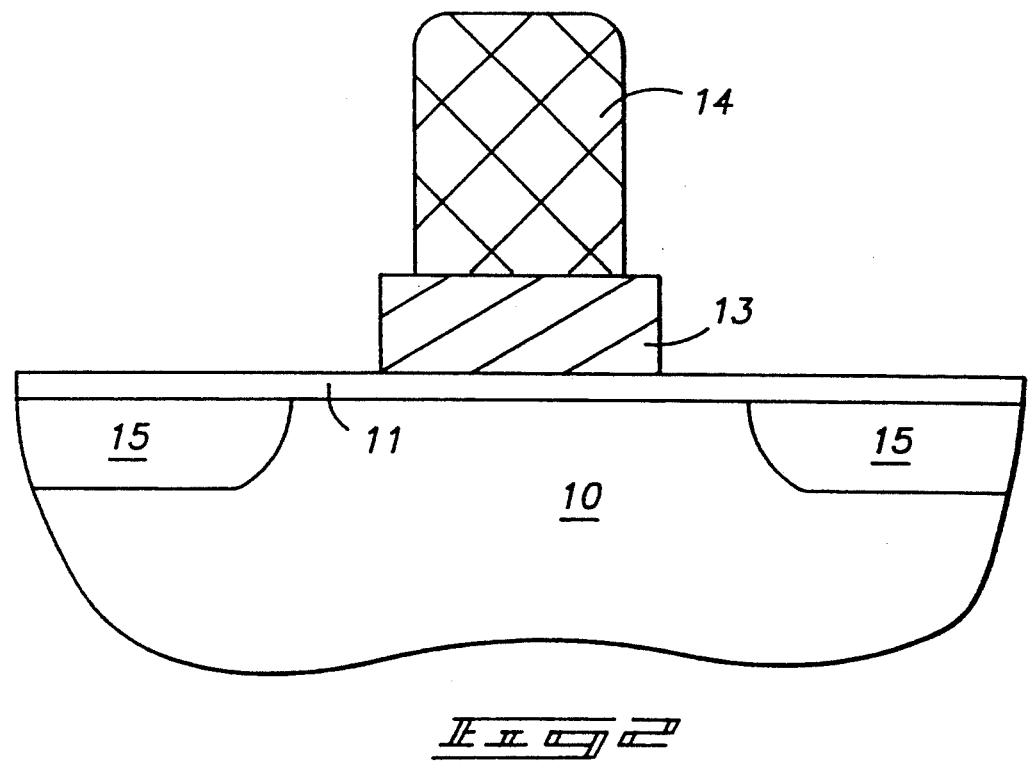
FIG. 2 is a similar view after the first implanting step.

Dopant can next be implanted adjacent to the gate 13, resulting in formation of first diffusion regions 15 in the substrate 10 (FIG. 2). The first diffusion regions 15 are initially located within an area of the substrate 10 spaced slightly from the adjacent edges of gate 13. Their boundaries are partially defined by the overhanging edges of the resist 14 during the implantation procedure.

The process further involves the subsequent step of isotropically etching the resist 14 to eliminate overhang, as illustrated in FIG. 2. Gate 13 continues to be covered with resist 14, which now does not extend beyond its edges.

Figure 3:
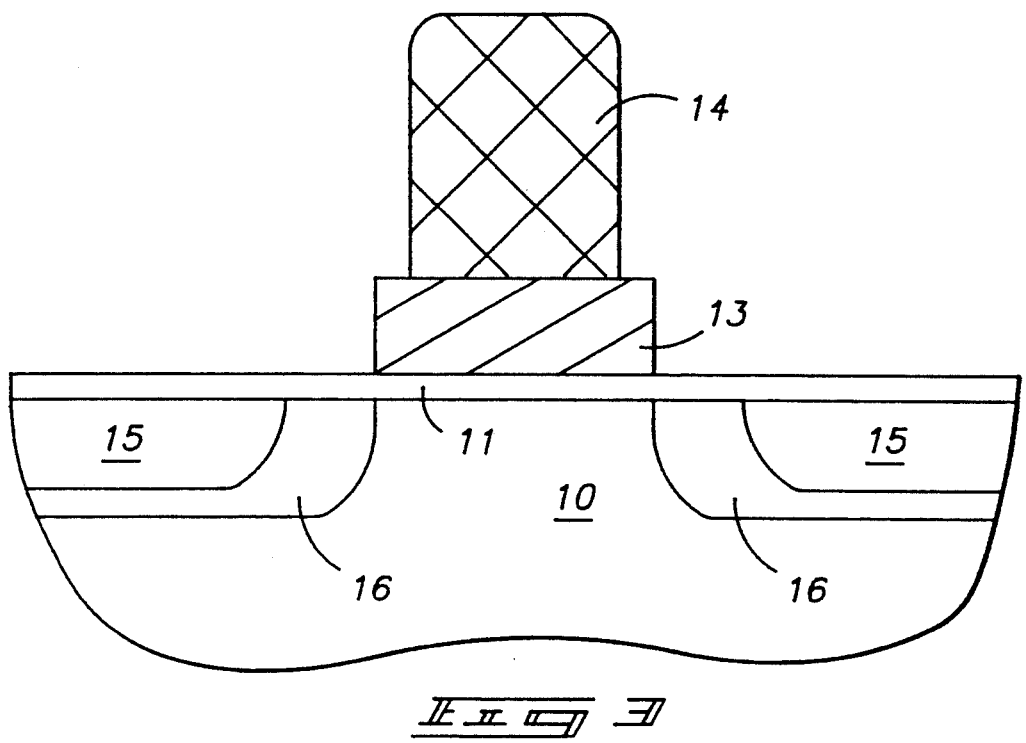
FIG. 3 is a similar view after halo implantation.

A second implantation with dopant then produces halo diffusion regions 16 within areas of substrate 10 that surround the first diffusion region 15. Each halo diffusion region 16 has a border partially defined by the adjacent edge of gate 13, as shown in FIG. 3. The poly gate 14 itself serves as a "mask" during the second implantation procedure.

Figure 4:
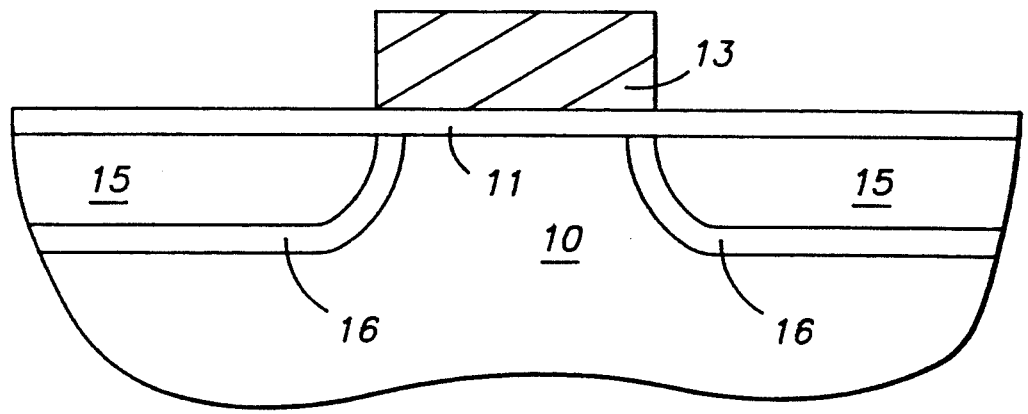
FIG. 4 is a similar view after annealing.

Subsequent heat treatment or annealing results in further areal extension of the diffusion regions, bringing the adjacent edges of the first diffusion regions 15 into alignment beneath the corresponding edges of gate 13, as illustrated in FIG. 4. The surrounding halo diffusion regions 16, which now extend slightly under gate 13, provides a local increase in the concentration of dopant within the surrounding tub or well in substrate 10 on which each transistor is formed. The resulting additional bias that can be attributed to this increase in dopant concentration helps to prevent the completed transistors from breaking down at short channel distances.

FIGS. 5-13 illustrate application of the method to split poly techniques in which the complementary transistors are processed separately, rather than being sequentially processed in tandem. FIG. 5 illustrates a prepared substrate 10 having a layer of thinoxide 11 covering the area in which each complementary transistor is to be produced. The areas of thinoxide 11 are separated by field oxide 12. When using a twin tub method of producing CMOS transistors, properly doped wells 17 and 18 are located inwardly from the areas of thin oxide 11. In the illustrated example, an n-well 17 and p-well 18 are formed within the outer layers of an n-substrate 10.

FIG. 6 illustrates a blanket of polysilicon 20 totally covering the oxide layers 11 and 12. The polysilicon 20 can be deposited on the oxide layers using conventional production techniques and processes. A blanket layer of resist 14 is next applied to the exposed surfaces of the layer of polysilicon 20. The formation of the layer of resist 14 is well known in this industry and no further details are believed to be necessary for an understanding by one skilled in it.

The production of the first transistor in a complementary pair is illustrated in FIG. 7. The layer of polysilicon 20 is patterned and etched by sequentially applying an anisotropic etch and an isotropic etch. This operational sequence produces resist overhangs covering the edges of the resulting poly gate 13, as well as resist overhangs along the edges of the remaining areas about the layer of polysilicon 20.

Subsequent implantation of a dopant produces first diffusion regions 15 spaced slightly from the gate 13, as shown in FIG. 7. The diffusion regions 15 are located within areas of the substrate 10 adjacent to the gate 13 and at opposite sides of it. Their boundaries are partially defined by the resist overhang covering the edges of gate 13. As will be seen below, the spacing of diffusion regions 15 from gate 13 facilitates accurate placement and formation of their surrounding halo diffusion regions.

Before implanting the halo diffusion regions, the resist 14 is isotropically etched (FIG. 8) to eliminate overhang, while continuing to substantially cover both the poly gate 13 and the remaining portions of the layer of polysilicon 20. The resist 14 should be etched to expose and slightly clear the edges of gate 13.

Figure 8:
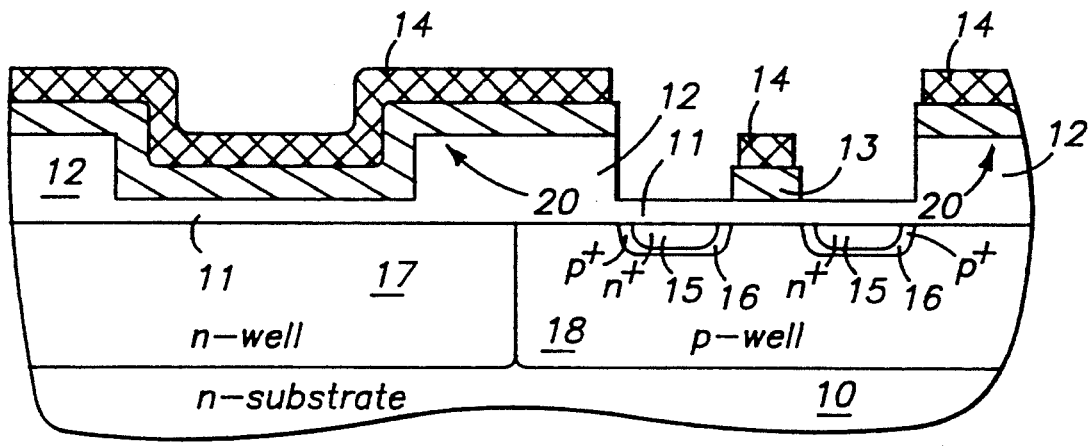
FIG. 8 is a similar view after implantation of substrate areas adjacent to the first gate.

Dopant for the halo diffusion regions can next be implanted within areas of the substrate surrounding the first diffusion regions 15. The resulting halo diffusion regions 16 have borders partially defined by the edges of the gate 13, which acts as a dopant mask. FIG. 8 illustrates substantial completion of the resulting N-channel device.

Figure 9:
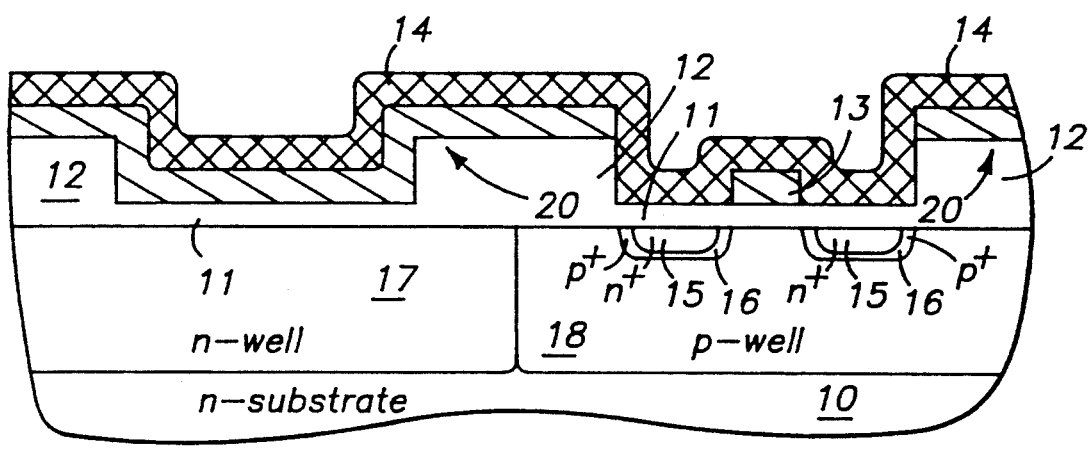
FIG. 9 is a view showing application of resist to the transistor areas.
Figure 10:
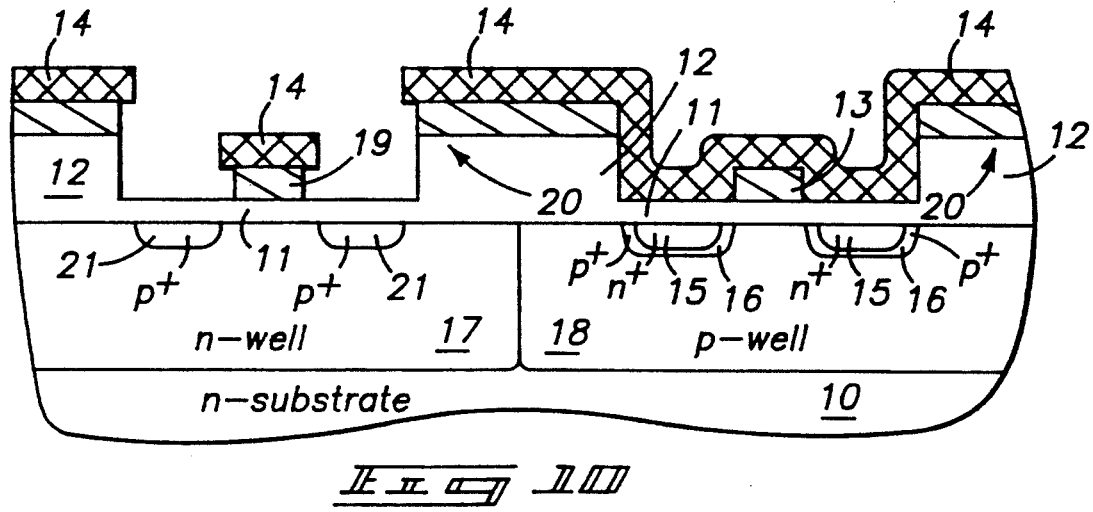
FIG. 10 is a similar view after etching of the second gate.
Figure 11:
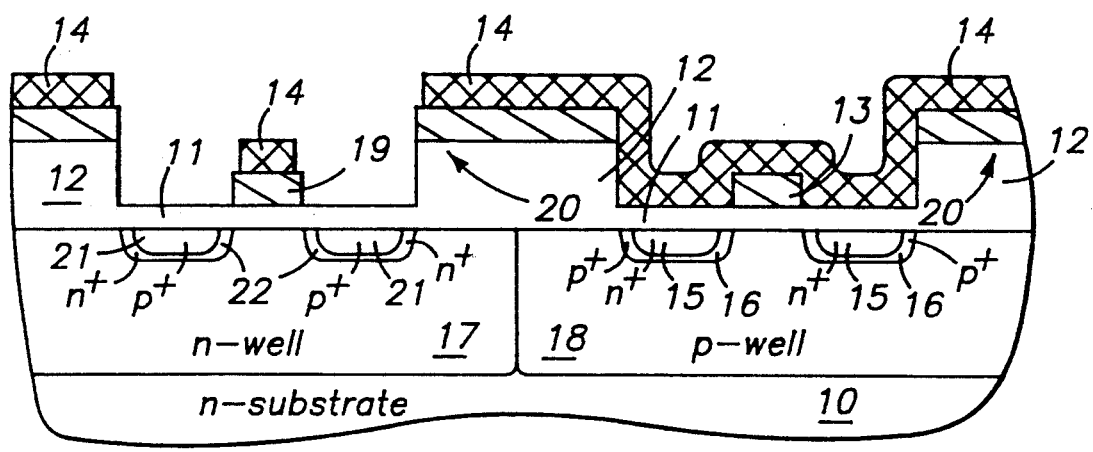
FIG. 11 is a similar view after implantation of substrate areas adjacent to the second gate.

Before initiating production of the complementary transistor, the blanket layer of resist 14 must be reestablished or reformed to cover exposed surfaces of the layer of polysilicon 20 and the first transistor, as shown in FIG. 9. The previously-described steps are then repeated to produce a resist overhang covering the second gate 19 (FIG. 10), to implant dopant to produce second diffusion regions 21, to isotropically etch the resist 14 to eliminate overhang (FIG. 11) and to implant dopant to produce halo diffusion regions 22 surrounding the second diffusion regions 21 (FIG. 11).

Figure 12:
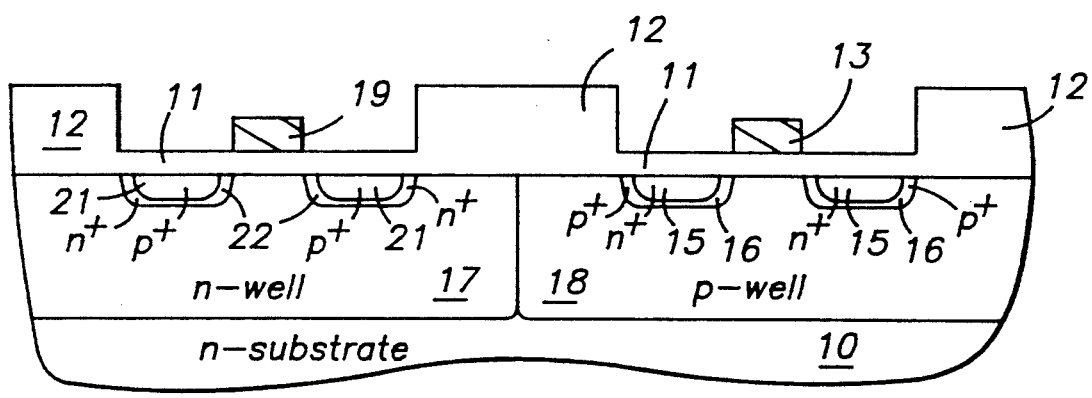
FIG. 12 is a view after removal of resist and poly.
Figure 13:
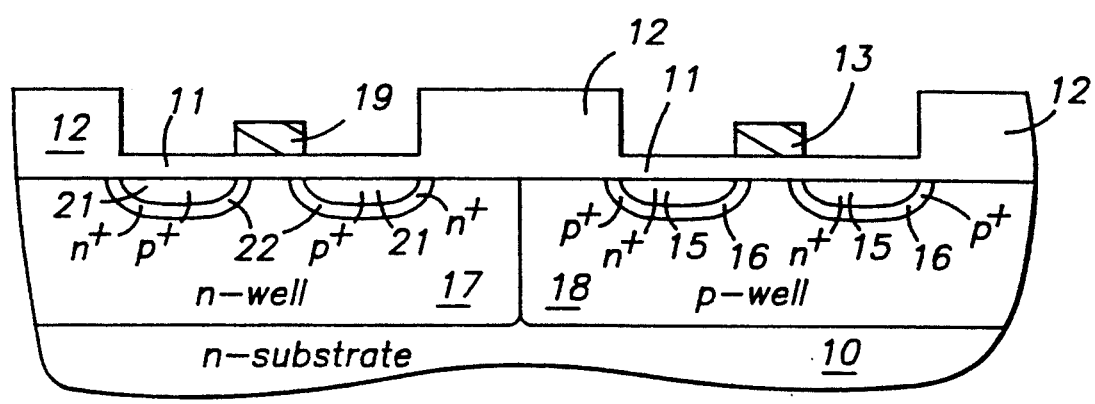
FIG. 13 is a similar view after annealing of the complementary devices.

The resulting complementary transistors are diagrammatically illustrated in FIG. 12 following removal of resist 14 and any remaining unneeded areas of polysilicon.

The formed transistors can then be annealed to extend the first and second diffusion regions 15, 21 to the edges of the first and second gates 13, 19, respectively. This annealing step accurately locates the edges of the diffusion regions directly under the edges of the gates, and accurately spaces the halo diffusion regions apart from one another in a small channel dimension.

The above method can also be applied only to the production of the second transistor in a complementary pair produced by using split poly techniques. The first transistor would first be formed using conventional techniques. The steps diagrammatically illustrated in FIGS. 9-13 would then be utilized in the manner just described.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method of implanting a diffusion region of a MOS transistor as the transistor is being formed on a supporting substrate, comprising the following steps:
   patterning and etching a gate by sequential application of a resist, followed by an anisotropic etch and an isotropic etch to produce a resist overhang covering one edge of the gate;
   implanting a dopant to produce a first diffusion region located within an area of the substrate adjacent to the gate and partially defined by the resist overhang covering the one edge of the gate;
   isotropically etching the remaining resist on the gate to eliminate overhang while retaining the resist over the gate; and
   implanting additional dopant to product a halo diffusion region within an area of the substrate that surrounds the first diffusion region and has a border partially defined by the one edge of the gate.

2. The method of claim 1, where the gate comprises part of a p-channel device.

3. The method of claim 1, where the gate comprises part of a n-channel device.

4. The method of claim 1, comprising the following additional step:
   applying heat to extend the first diffusion region to the edges of the gate.

5. A method of implanting a diffusion region of a MOS transistor as the transistor is being formed on a supporting substrate, comprising the following steps:
   applying resist to exposed surfaces of a layer of polysilicon deposited over a thin layer of silicon dioxide on the substrate;
   patterning and etching a gate in the layer of polysilicon by sequentially applying an anisotropic etch and an isotropic etch to produce a resist overhang;
   implanting a dopant to produce a first diffusion region located within an area of the substrate adjacent to the gate and partially defined by the resist overhang;
   isotropically etching the resist to eliminate overhang while retaining the resist over the gate; and
   implanting additional dopant to produce a halo diffusion region within an area of the substrate that surrounds the first diffusion region and has a border partially defined by the one edge of the gate.

6. The method of claim 1, where the gate comprises part of a p-channel device.

7. The method of claim 1, where the gate comprises part of a n-channel device.

8. The method of claim 1, comprising the following additional step:
applying heat to extend the first diffusion region to the edges of the gate.

9. A method of implanting diffusion regions of MOS transistors during their production by use of split-poly techniques in which differing transistors are processed separately, comprising the following steps:
applying a layer of polysilicon over a thin layer of silicon dioxide to a supporting substrate;
applying a blanket layer of resist to exposed surfaces of the polysilicon and substrate;
patterning and etching a gate in the layer of polysilicon by sequentially applying an anisotropic etch and an isotropic etch to produce resist overhangs covering the edges of the gate and the remaining areas about the layer of polysilicon;
implanting a dopant to produce first diffusion regions located within an area of the substrate adjacent to the gate and partially defined by the resist overhang covering the edges of the gate;
isotropically etching the resist to eliminate overhang while retaining the resist over both the gate and the remaining layer of polysilicon; and
implanting additional dopant to produce halo diffusion regions within areas of the substrate that surround the first diffusion regions and having borders partially defined by the edges of the gate.

10. The method of claim 9, where the gate comprises part of a p-channel device.

11. The method of claim 9, where the gate comprises part of a n-channel device.

12. The method of claim 9, comprising the following additional step:
applying heat to extend the first diffusion region to the edges of the gate.

13. A method of implanting diffusion regions of a CMOS transistor as the transistor is being formed by use of split-poly techniques in which a complementary transistor having a gate produced from a layer of polysilicon and adjacent diffusion regions is first formed on a common substrate, comprising the following steps:
applying a blanket layer of resist covering the first-formed transistor and the exposed surfaces of the layer of polysilicon on top of a thin layer of silicon dioxide between the polysilicon and substrate;
patterning and etching a transistor gate in the layer of polysilicon by sequentially applying an anisotropic etch and an isotropic etch to produce resist overhangs;
implanting a dopant to produce first diffusion regions on the substrate that are located within areas adjacent to the transistor gate under formation and partially defined by the resist overhang;
isotropically etching the resist to eliminate overhang while retaining the resist over the transistor gate; and
implanting additional dopant to produce halo diffusion regions within areas of the substrate that surround the first diffusion regions and having borders partially defined by edges of the gate.

14. The method of claim 13, where the gate comprises part of a p-channel device.

15. The method of claim 13, where the gate comprises part of a n-channel device.

16. The method of claim 13, comprising the following additional step:
applying heat to the formed transistors to extend the first diffusion regions to the edges of the gate.

17. A method of implanting diffusion regions of a CMOS transistor using split-poly techniques in which complementary transistors are processed separately, comprising the following steps:
applying a layer of polysilicon over a thin silicon dioxide layer on a supporting substrate;
applying a blanket layer of resist to the layer of polysilicon;
patterning and etching a gate for a first transistor in the layer of polysilicon by sequentially applying an anisotropic etch and an isotropic etch to produce resist overhangs covering the gate of the first transistor and the remaining areas about the layer of polysilicon;
implanting a dopant to produce first diffusion regions on the substrate that are located within areas adjacent to the gate of the first transistor and are partially defined by the resist overhang;
isotropically etching the resist to eliminate overhang while continuing to cover both the gate of the first transistor and the remaining areas about the layer of polysilicon;
implanting additional dopant to produce halo diffusion regions within areas of the substrate that surround the first diffusion regions and having borders partially defined by edges of the gate of the first transistor to complete its formation;
reestablishing a blanket layer of resist;
patterning and etching a gate of a second transistor in the layer of polysilicon by sequentially applying an anisotropic etch and an isotropic etch to produce resist overhangs covering the gate of the second transistor;
implanting a dopant to produce second diffusion regions on the substrate that are located within areas adjacent to the gate of the second transistor and partially defined by the resist overhang;
isotropically etching the resist to eliminate overhang while retaining the resist over the gate and the first transistor; and
implanting additional dopant to produce halo diffusion regions within areas of the substrate that surround the second diffusion regions and having borders partially defined by edges of the second gate to complete formation of the second transistor of the complementary pair.

18. The method of claim 17, comprising the following additional step:
applying heat to the formed transistors to extend the first and second diffusion regions to the edges of the first and second gates, respectively.

* * * * *